(12) United States Patent
Yoon

(10) Patent No.: US 8,062,937 B2
(45) Date of Patent: Nov. 22, 2011

(54) THIN-FILM TRANSISTOR SUBSTRATE, METHOD OF MANUFACTURING THE SAME AND DISPLAY PANEL HAVING THE SAME

(75) Inventor: Soo-Wan Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 770 days.

(21) Appl. No.: 11/829,332

(22) Filed: Jul. 27, 2007

(65) Prior Publication Data

US 2008/0023705 A1 Jan. 31, 2008

(30) Foreign Application Priority Data

Jul. 28, 2006 (KR) .................. 10-2006-0071166

(51) Int. Cl.
*H01L 29/94* (2006.01)

(52) U.S. Cl. ................. 438/151; 438/149; 257/E29.151

(58) Field of Classification Search ............... 257/72, 257/288, E29.151, E21.001, E29.003; 438/151, 438/48, 128, 149, 283
See application file for complete search history.

(56) References Cited

U.S. PATENT DOCUMENTS

| 5,311,041 A | 5/1994 | Tominaga et al. |
| 5,981,973 A * | 11/1999 | Matsuzaki et al. ............... 257/66 |
| 6,274,884 B1 * | 8/2001 | Lee et al. ......................... 257/57 |

FOREIGN PATENT DOCUMENTS

JP 07-120789 5/1995

* cited by examiner

*Primary Examiner* — Roy K Potter

(74) *Attorney, Agent, or Firm* — Innovation Counsel LLP

(57) ABSTRACT

A thin-film transistor (TFT) substrate includes a gate electrode, a gate insulation pattern, a channel pattern, a first organic insulation pattern, a source electrode and a drain electrode. The gate electrode is formed on a base substrate. The gate insulation pattern is formed on the gate electrode and is smaller than the gate electrode. The channel pattern is formed on the gate insulation pattern and the channel pattern is smaller than the gate electrode. The first organic insulation pattern is formed on the base substrate to cover the channel pattern, the gate insulation pattern and the gate electrode.

12 Claims, 24 Drawing Sheets

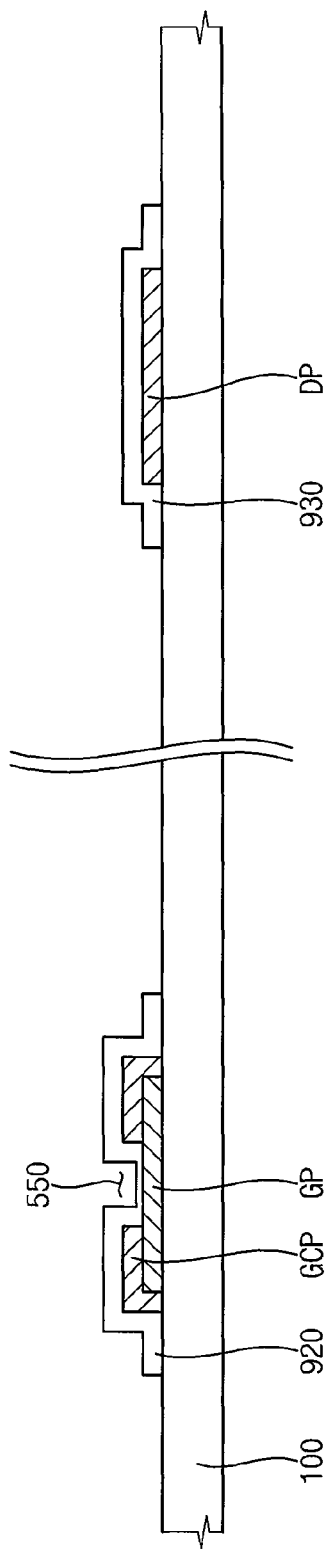

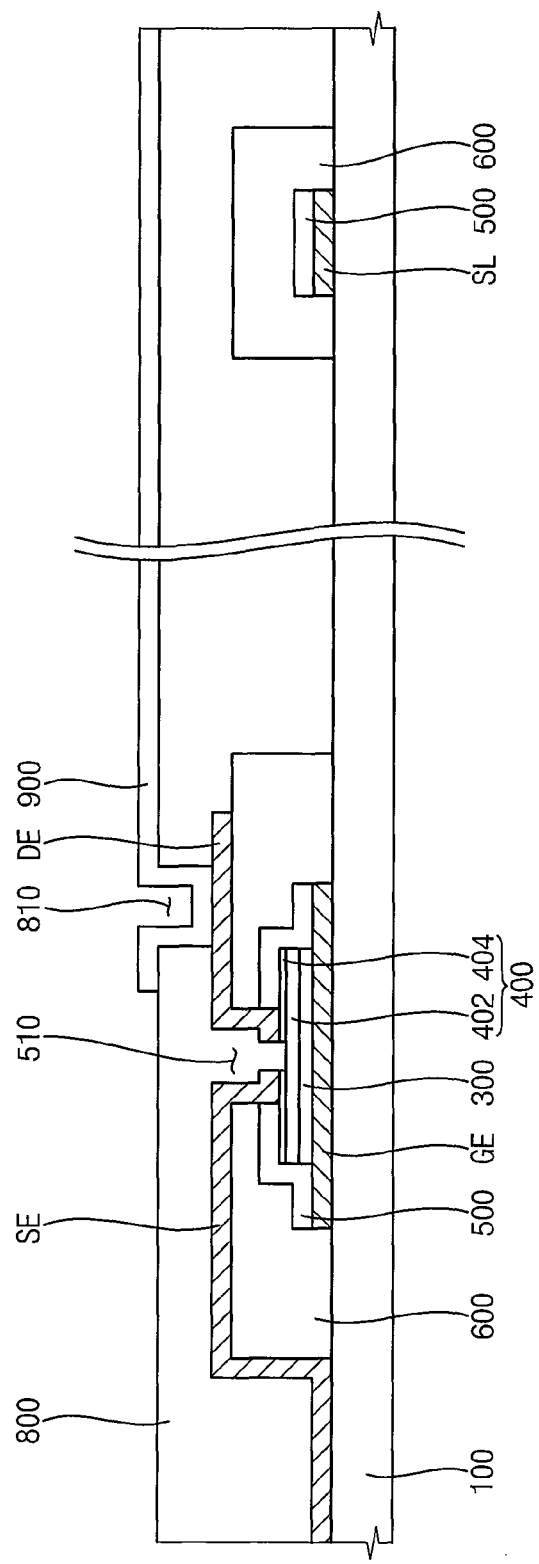

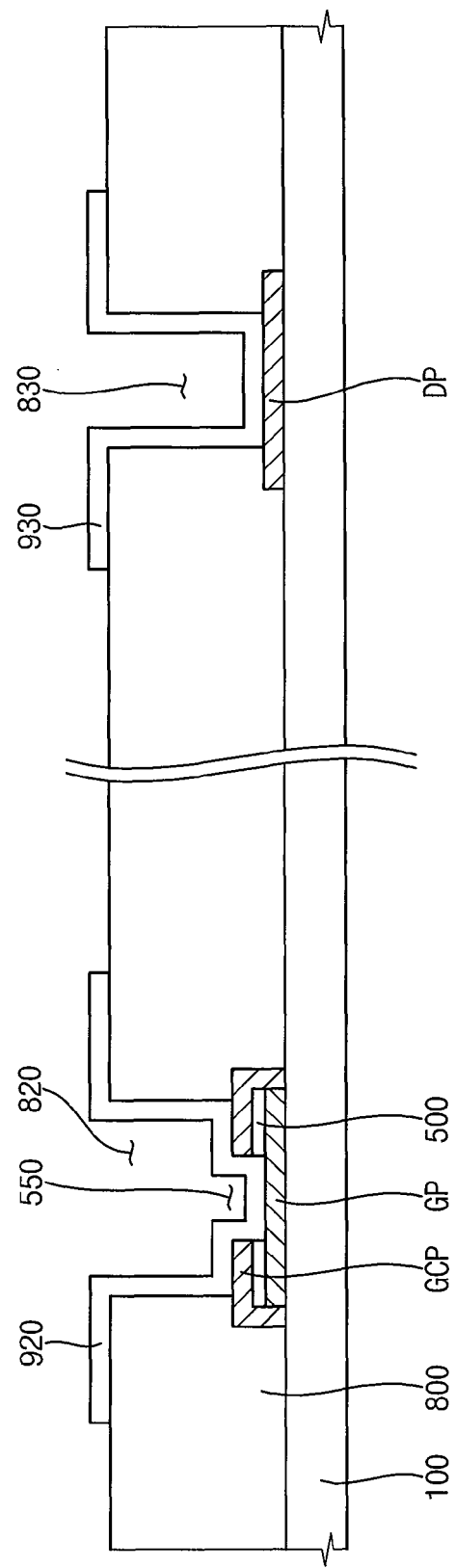

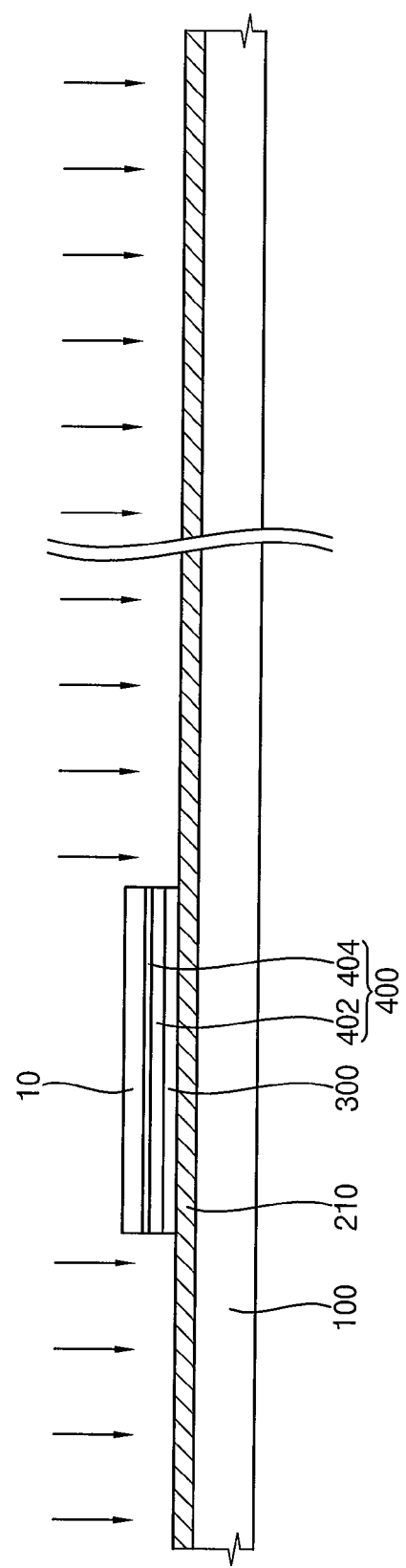

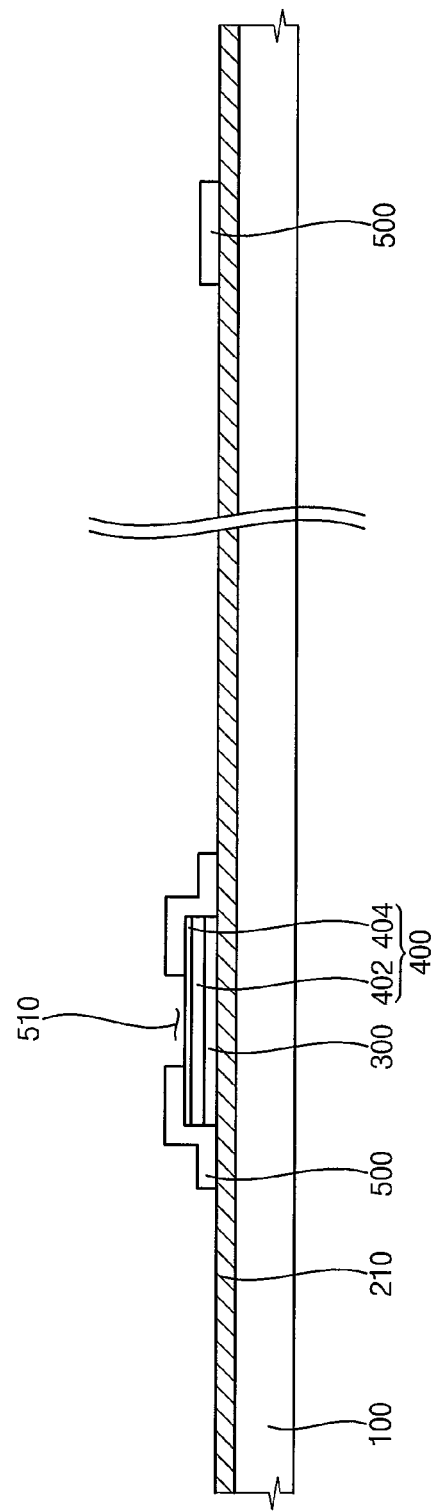

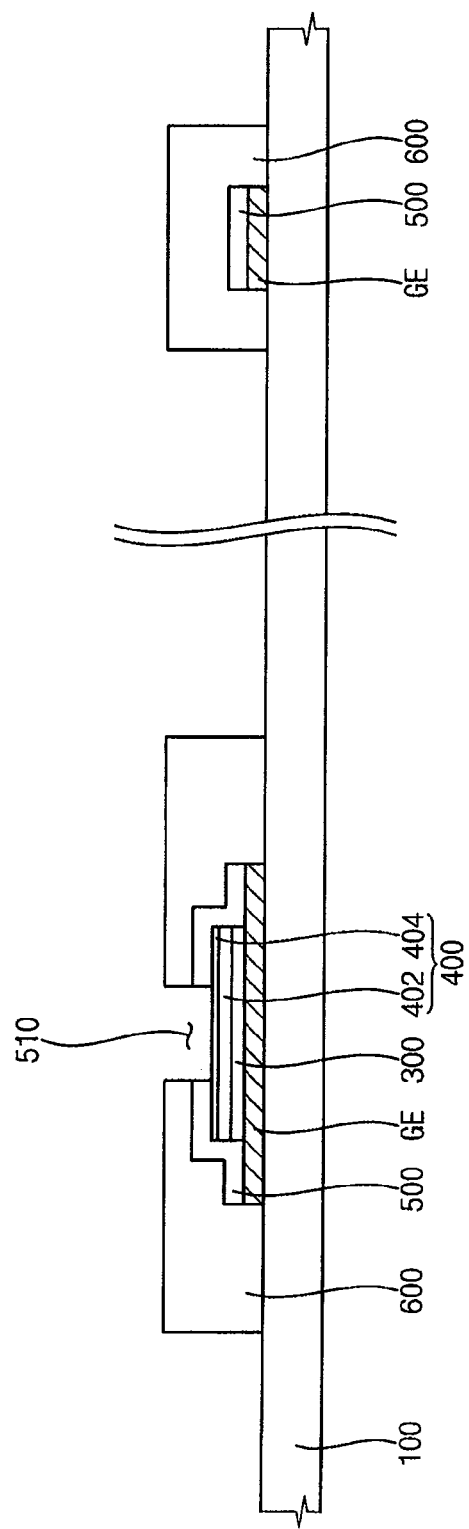

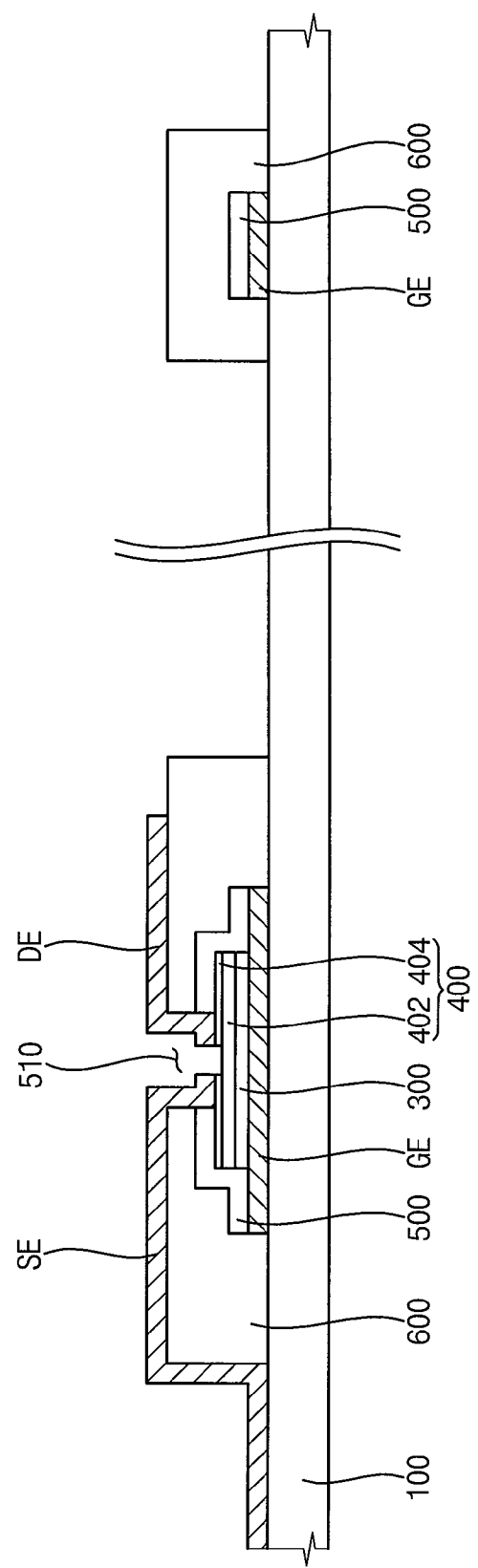

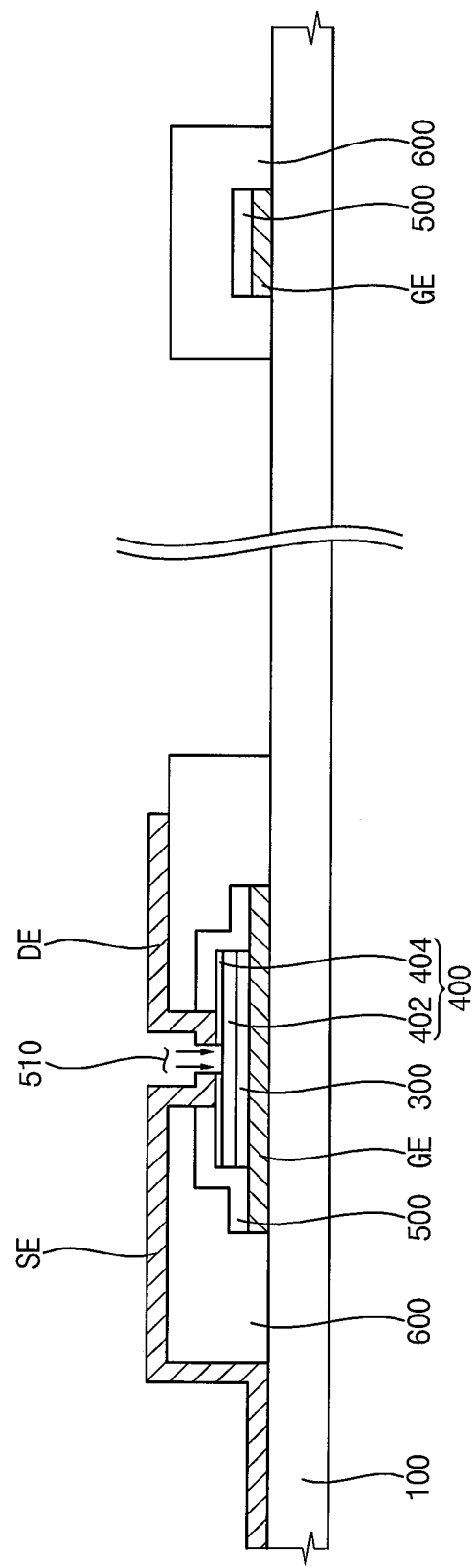

THIN-FILM TRANSISTOR SUBSTRATE, METHOD OF MANUFACTURING THE SAME AND DISPLAY PANEL HAVING THE SAME

CROSS-REFERENCE TO RELATED APPLICATIONS

This application relies for priority upon Korean Patent Application No. 10-2006-71166 filed on Jul. 28, 2006 the contents of which are herein incorporated by reference in its entirety.

BACKGROUND OF THE INVENTION

1. Field of the Invention

The present invention relates to a thin-film transistor (TFT) substrate, a method of manufacturing the TFT substrate and a display panel having the TFT substrate. More particularly, the present invention relates to a TFT substrate capable of preventing and/or reducing a mis-alignment between layers thereof, a method of manufacturing the TFT substrate and a display panel having the TFT substrate.

2. Description of the Related Art

Generally, a liquid crystal display (LCD) apparatus includes an LCD panel and a backlight assembly. The LCD panel displays an image using the optical and electrical properties of liquid crystal, and the backlight assembly provides the LCD panel with light.

The LCD panel includes a thin-film transistor (TFT) substrate, a color filter substrate facing the TFT substrate and a liquid crystal layer interposed between the TFT substrate and the color filter substrate.

The TFT substrate includes a base substrate, a gate electrode, a gate insulation layer, a channel pattern, a source electrode and a drain electrode. The gate electrode is formed on the base substrate, and the gate insulation layer is formed on the base substrate to cover the gate electrode. The channel pattern is formed on the gate insulation layer and is overlapped with the gate electrode. The source electrode and the drain electrode are formed on the channel pattern, and are electrically insulated from each other. Recently, the base substrate may consist of a transparent synthetic resin to reduce the weight and manufacturing cost of the base substrate.

Generally, the TFT substrate is formed through a chemical vapor deposition (CVD) method or a sputtering method. A gate metal layer is deposited through the sputtering method, and then patterned to form the gate electrode. A semiconductor layer is deposited through a plasma enhanced chemical vapor deposition (PECVD) method at a relatively high temperature, and then patterned to form the channel pattern.

Since the channel pattern is formed at a relatively high temperature, the case substrate including the transparent synthetic resin is deformed. Thus, a mis-alignment between the gate electrode and the channel pattern is caused. The mis-alignment between the gate electrode and the channel pattern deteriorates a display quality.

SUMMARY OF THE INVENTION

The present invention provides a thin-film transistor (TFT) substrate capable of preventing and/or reducing a mis-alignment between layers thereof to improve a display quality.

The present invention also provides a method of manufacturing the above-mentioned TFT substrate.

The present invention also provides a display panel having the TFT substrate.

In one aspect of the present invention, a TFT substrate includes a gate electrode, a gate insulation pattern, a channel pattern, a first organic insulation pattern, a source electrode and a drain electrode. The TFT substrate may further include a pixel electrode.

The gate electrode is formed on a base substrate. The gate insulation pattern is formed on the gate electrode and is smaller than the gate electrode. The channel pattern is formed on the gate insulation pattern and has a shape substantially the same as a shape of the gate insulation pattern. The first organic insulation pattern is formed on the base substrate to cover the channel pattern, the gate insulation pattern and the gate electrode and has an opening to expose a portion of the channel pattern. The source electrode and the drain electrode are formed on the first organic insulation pattern and make contact with the channel pattern through the opening and are spaced apart from the source electrode by a predetermined distance. The pixel electrode is electrically connected to the drain electrode and includes a transparent conductive material.

For example, the TFT substrate may further include a protective layer disposed in the opening to protect an exposed portion of the channel pattern. Furthermore, the TFT substrate may further include a second organic insulation pattern that is formed on the base substrate to cover the source electrode, the drain electrode and the first organic insulation pattern and has a contact hole formed on the drain electrode. The pixel electrode may be formed on the second organic insulation pattern and may be electrically connected to the drain electrode through the contact hole.

In another aspect of the present invention, there is provided a method of manufacturing a TFT substrate. In the method, a gate metal layer, a gate insulation layer and a channel layer are sequentially formed on a base substrate. The channel layer and the gate insulation layer are patterned through the same process to form a channel pattern and a gate insulation pattern having a shape substantially the same as a shape of the channel pattern. The gate metal layer is patterned to form a gate electrode larger than the gate insulation pattern. A first organic insulation pattern is formed to cover the gate insulation pattern and the gate electrode. The first organic insulation pattern has an opening to expose a portion of the channel pattern. A source electrode and a drain electrode are formed to make contact with the channel pattern through the opening. The source electrode and the drain electrode are spaced apart from each other by a predetermined distance. For example, a pixel electrode electrically connected to the drain electrode may be formed.

Furthermore, an ink may be sprayed in the opening to form a protective layer to protect an exposed portion of the channel pattern, and a second organic insulation pattern may be formed to cover the source electrode, the drain electrode and the first organic insulation pattern to planarize a surface of the base substrate. The second organic insulation pattern has an opening to expose a portion of the drain electrode.

In still another aspect of the present invention, a display panel includes a TFT substrate, an opposite substrate facing the TFT substrate and a liquid crystal layer interposed between the TFT substrate and the opposite substrate.

The TFT substrate includes a gate electrode, a gate insulation pattern, a channel pattern, a first organic insulation pattern, a source electrode, a drain electrode and a pixel electrode. The gate electrode is formed on a base substrate. The gate insulation pattern is formed on the gate electrode and is smaller than the gate electrode. The channel pattern is formed on the gate insulation pattern and has a shape substantially the same as a shape of the gate insulation pattern. The first organic insulation pattern is formed on the base substrate to cover the channel pattern, the gate insulation pattern and the gate electrode and has an opening to expose a portion of the channel pattern. The source electrode and the drain electrode are formed on the first organic insulation pattern and make contact with the channel pattern through the opening and are spaced apart from the source electrode by a predetermined distance. The pixel electrode is electrically connected to the drain electrode and includes a transparent conductive material.

According to the above, a mis-alignment between the channel pattern and the gate electrode may be prevented. Therefore, display quality may be improved.

BRIEF DESCRIPTION OF THE DRAWINGS

The above and other advantages of the present invention will become readily apparent by reference to the following detailed description when considered in conjunction with the accompanying drawings wherein:

FIGS. 1B, 1C, 1D and 1E are cross-sectional views illustrating the TFT substrate according to an exemplary embodiment of the present invention;

FIGS. 2A and 2B are cross-sectional views illustrating a TFT substrate according to another exemplary embodiment of the present invention;

FIGS. 3B, 3C, 3D and 3E are cross-sectional views illustrating the method of manufacturing a TFT substrate according to an exemplary embodiment of the present invention;

FIGS. 4B, 4C, 4D and 4E are cross-sectional views illustrating a process of forming a gate electrode in the method of manufacturing a TFT substrate according to an exemplary embodiment of the present invention;

FIG. 5B is a cross-sectional view illustrating a process of forming a first organic insulation pattern in a method of manufacturing a TFT substrate according to an exemplary embodiment of the present invention. Particularly, FIG. 5B is a cross-sectional view taken along a line of VII-VII' of FIG. 5A.

FIGS. 6B, 6C, 6D and 6E are cross-sectional views illustrating a process of forming a source electrode and a drain electrode in the method of manufacturing a TFT substrate according to an exemplary embodiment of the present invention.

DESCRIPTION OF THE EMBODIMENTS

Figure 1A:
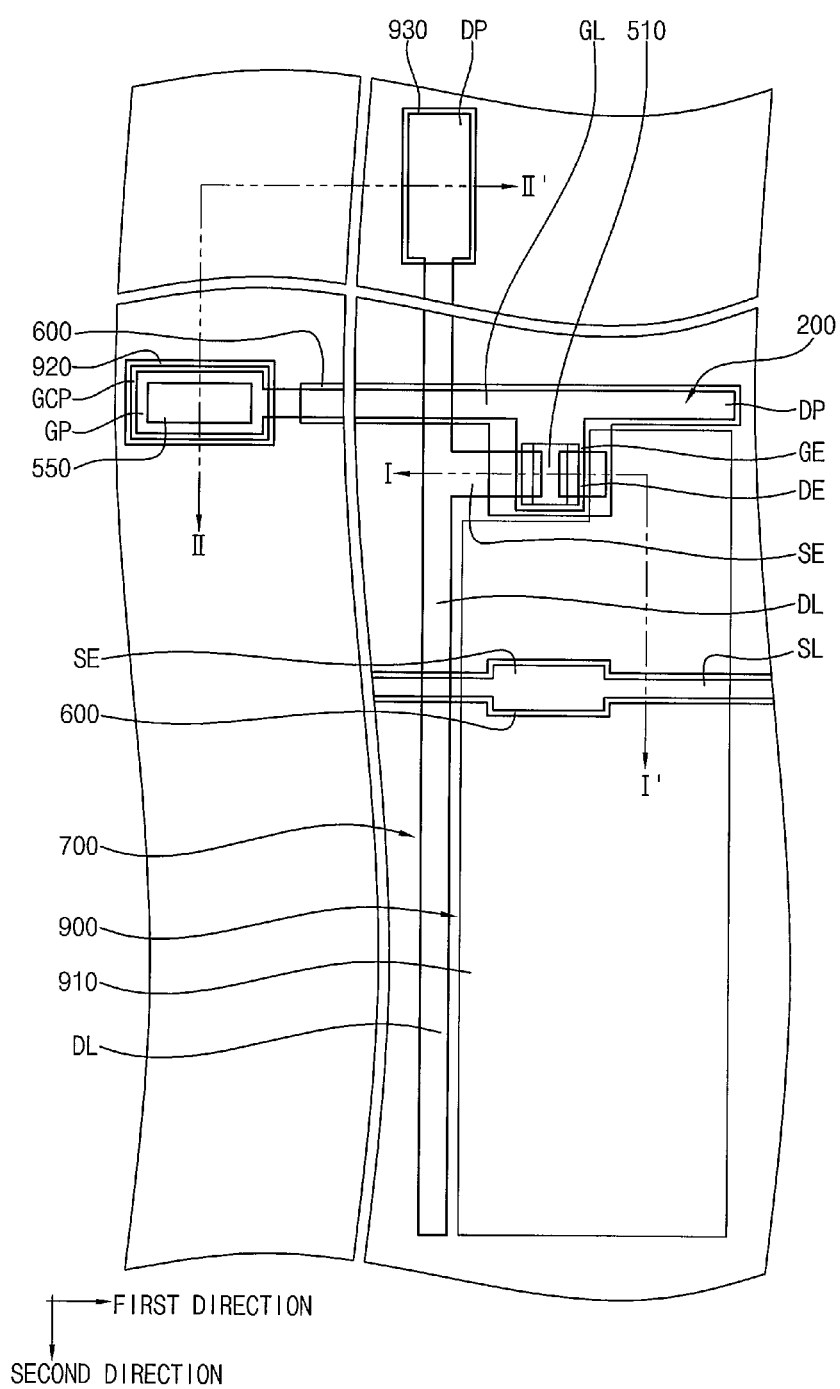
FIG. 1A is a plan view illustrating a thin-film transistor (TFT) substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to nonimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Thin-Film Transistor Substrate

Figure 1B:
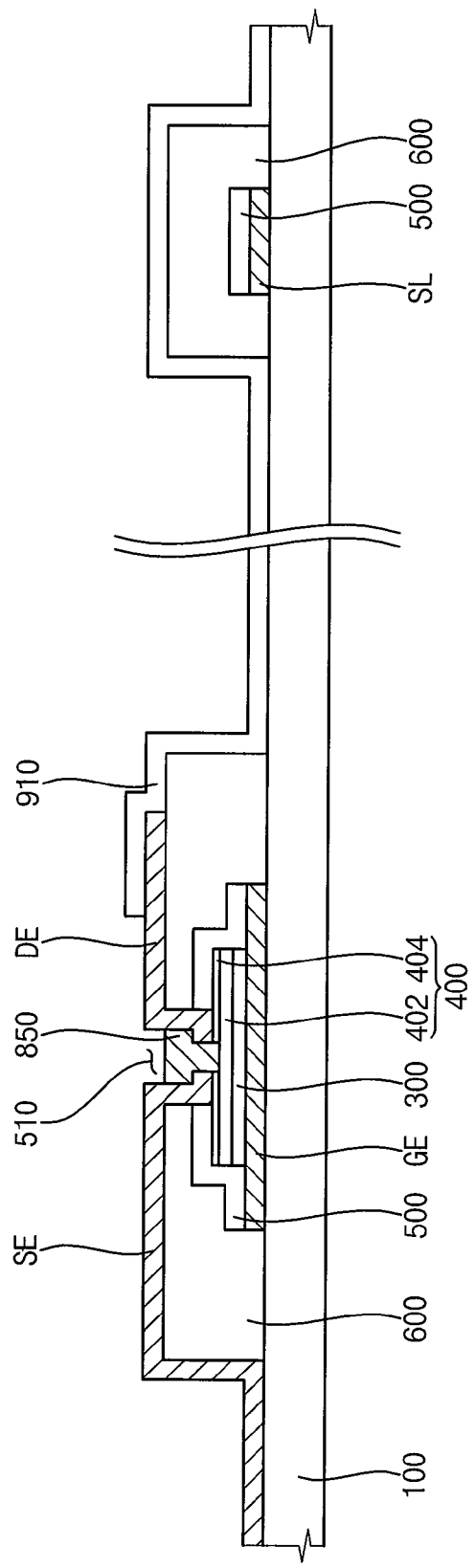
Figure 1C:
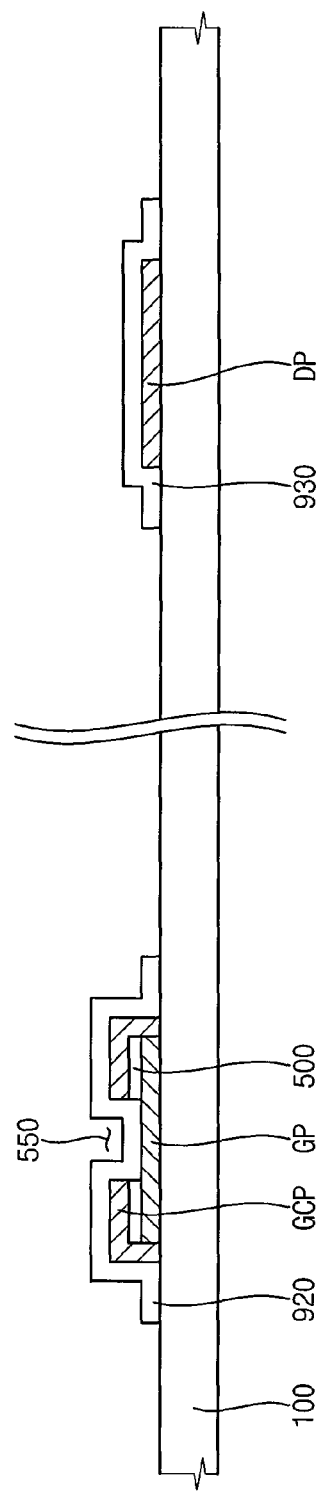
Figure 1D:
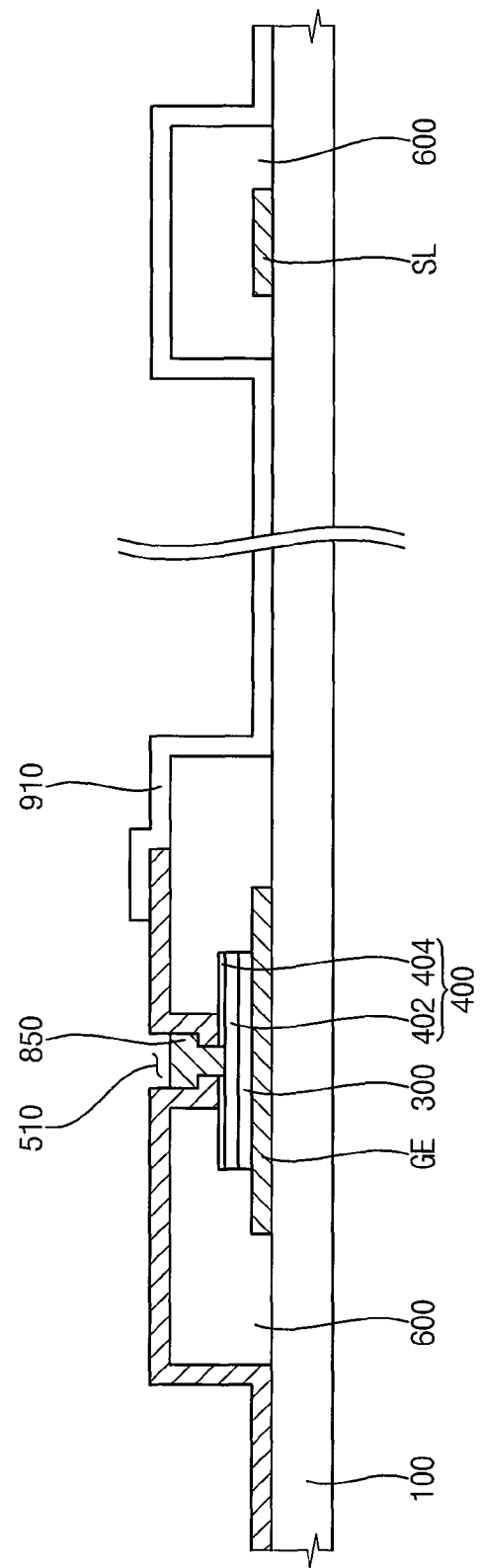

FIG. 1A is a plan view illustrating a thin-film transistor (TFT) substrate according to an exemplary embodiment of the present invention, and FIGS. 1B, 1C, 1D and 1E are cross-sectional views illustrating the TFT substrate according to an exemplary embodiment of the present invention. Particularly, FIG. 1A is an enlarged plan view illustrating a portion of the TFT substrate according to an exemplary embodiment of the present invention. FIG. 1B is a cross-sectional view taken along a line I-I' of FIG. 1A. FIG. 1C is a cross-sectional view taken along a line II-II' of FIG. 1A. FIG. 1D is a cross-sectional view taken along a line I-I' of FIG. 1A without an alignment insulation pattern. FIG. 1E is a cross-sectional view taken along a line II-II' of FIG. 1A without an alignment insulation pattern.

A TFT substrate may be employed, for example, in a display panel. The display panel may include the TFT substrate, an opposite substrate and a liquid crystal layer.

The TFT substrate includes a plurality of pixel electrodes, a plurality of TFTs and a plurality of signal lines. The pixel electrodes are arranged in a matrix configuration. The TFTs apply a driving voltage to the pixel electrodes. The signal lines operate the TFTs.

The opposite substrate faces the TFT substrate. The opposite substrate includes a common electrode and a plurality of color filters. The common electrode includes a transparent conductive material, and each of the color filters is overlapped with each of the pixel electrodes. Examples of the color filters may include a red color filter, a green color filter, a blue color filter, etc.

The liquid crystal layer is interposed between the TFT substrate and the opposite substrate, and is rearranged by an electric field formed between the pixel electrodes and the common electrode. The rearranged liquid crystal layer controls a transmittance of light externally provided, and the light passes through the color filters to display an image.

Hereinafter, the TFT substrate according to an exemplary embodiment of the present invention will be described more fully with reference to FIGS. 1A to 1C.

The TFT substrate includes a base substrate 100, a gate metal pattern 200, a gate insulation pattern 300, a channel pattern 400, an alignment insulation pattern 500, an organic insulation pattern 600, a data metal pattern 700, a transparent metal pattern 900 and a protective layer 850.

The base substrate 100 may have a plate-shape, and includes a transparent material. Examples of a material that may be used for the base substrate 100 may include glass or, quartz. The base substrate 100 may include a transparent synthetic resin to reduce the weight and manufacturing cost of the base substrate 100.

The gate metal pattern 200 is formed on the base substrate 100, and includes a gate line GL, a gate electrode GE, a gate metal pad GP, a storage line SL and a storage electrode SE.

The gate line GL extends in a first direction on the base substrate 100, and a plurality of the gate lines GL may be arranged in a second direction substantially perpendicular to the first direction. The gate lines GL crosses data lines DL to define a plurality of pixels.

The gate electrode GE protrudes from the gate line GL in the second direction by a predetermined length. The gate electrode GE may have a substantially rectangular shape when viewed from a plan view.

The gate metal pad GP is formed at an end of the gate line GL. The gate metal pad GP may have a substantially rectangular shape when viewed from a plan view.

The storage line SL extends in the first direction on the base substrate 100 to cross the pixels. A plurality of the storage lines SL may be arranged in the second direction.

The storage electrode SE is formed in each of the pixel, and is electrically connected to the storage line SL. The storage electrode SE may have a substantially rectangular shape when viewed from a plan view.

The gate insulation pattern 300 is formed on the gate electrode GE. The gate insulation pattern 300 is smaller than the gate electrode GE when viewed from a plan view. For example, the gate insulation pattern 300 may be on a central portion of the gate electrode GE. Examples of a material that may be used for the gate insulation pattern 300 may include silicon nitride (SiNx), or silicon oxide (SiOx).

The channel pattern 400 is formed on the gate insulation pattern 300 and may have a shape substantially the same as the gate insulation pattern 300 when viewed from a plan view. The channel pattern 400 includes an active pattern 402 and an ion-doped pattern 404. The active pattern 402 is formed on the gate insulation pattern 300 and may have a shape substantially the same as the gate insulation pattern 300 when viewed from a plan view. For example, the active pattern 402 may include an amorphous silicon (a-Si).

The ion-doped pattern 404 is formed on the active pattern 402. Thus, an edge of the ion-doped pattern 404 may coincide with an edge of the gate insulation pattern 300 and an edge of the active pattern 402. The ion-doped pattern 404 includes two portions spaced apart from each other. One of the two portions makes contact with a source electrode SE, and the remaining one of the two portions makes contact with a drain electrode DE. For example, the ion-doped pattern 404 may include amorphous silicon into which $n^+$ impurities are implanted at a high concentration.

The alignment insulation pattern 500 is formed on the gate metal pattern 200, and overlaps with the gate metal pattern 200. Edges of the alignment insulation pattern 500 coincide with edges of the gate metal pattern 200.

Particularly, the alignment insulation pattern 500 is formed on the gate line GL, the gate electrode GE, the gate metal pad GP, the storage line SL and the storage electrode SE. The alignment insulation pattern 500 formed on the gate electrode GE covers the channel pattern 400 and a portion of the gate insulation pattern 300, and has an opening to expose a central portion of the channel pattern 400. Furthermore, the alignment insulation pattern 500 formed on the gate metal pattern GP further has an opening to expose a central portion of the gate metal pad GP.

Examples of a material that may be used for the alignment insulation pattern 500 may include silicon nitride ($Si_xN_y$), or silicon oxide ($Si_xO_y$), and other insulating materials.

The organic insulation pattern 600 is formed on the base substrate 100, and covers the gate line GL, the gate electrode GE, the storage line SL and the storage electrode SE. The organic insulation pattern 600 is large enough to cover the gate line GL, the gate electrode GE, the storage line SL and the storage electrode SE.

Particularly, the organic insulation pattern 600 is formed on the base substrate 100 to cover the alignment insulation pattern 500, the channel pattern 400, the gate insulation pattern 300 and the gate electrode GE. The organic insulation pattern 600 has an opening that overlaps with the opening to the alignment insulation pattern 500, which exposes the central portion of the channel pattern 400. More particularly, a channel opening 510 is formed in the central portion of the channel pattern 400 through the alignment insulation pattern 500 and the organic insulation pattern 600.

The data metal pattern 700 includes a data line DL, a source electrode SE, a drain electrode DE, a data metal pad DP and gate connection pas GCP.

The data line DL extends in the second direction, and crosses the gate line GL. A plurality of the data lines DL may be arranged in the second direction. The data line DL is electrically insulated from the gate line GL by the organic insulation pattern 600 and the alignment insulation pattern 500.

The source electrode SE protrudes from the data line DL in the first direction by a predetermined length. The source electrode SE is formed on a portion of the base substrate 100 and the organic insulation pattern 600 and in the channel opening 510 to make contact with a portion of the ion-doped pattern 402 of the channel pattern 400.

The drain electrode DE is spaced apart from the source electrode SE by a predetermined distance, and is formed on the organic insulation pattern 600. A portion of the drain electrode DE is disposed in the channel opening 510 to make contact with a portion of the ion-doped pattern 402 of the channel pattern 400.

The data metal pad DP is formed at an end of the data line DL. The data metal pad DP may have a substantially rectangular shape when viewed from a plan view.

The gate connection pad GCP is formed on the base substrate 100 to cover the alignment insulation pattern 500 and the gate metal pad GP. The gate connection pad GCP has an opening overlapped with the opening to the alignment insulation pattern 500, which exposes the central portion of the gate metal pad GP. Particularly, a gate pad contact hole 550 is formed through the alignment insulation pattern 500 and the gate connection pad GCP to expose the central portion of the gate metal pad GP. The gate connection pad GCP makes contact with a side surface of the gate metal pad GP thereby being electrically connected to the gate metal pad GP.

The transparent metal pattern 900 may include, for example, a transparent conductive material, such as, indium tin oxide (ITO), or amorphous indium tin oxide (a-ITO). The transparent metal pattern 900 includes a pixel electrode 910, a gate transparent pad 920 and a data transparent pad 930.

The pixel electrode 910 is overlapped with a portion of the drain electrode DE, and is electrically connected to the drain electrode DE. The pixel electrode 910 is formed in each of the pixels, and is disposed on the base substrate 100 and the organic insulation pattern 600.

The gate transparent pad 920 covers the gate connection pad GCP, the alignment insulation pattern 500 and the gate metal pad GP, and is electrically connected to the gate metal pad GP through the gate pad contact hole 550. For example, the gate transparent pad 920 may have a substantially rectangular shape when viewed from a plan view.

The data transparent pad 930 is formed on the base substrate 100 to cover the data metal pad DP. Thus, the data transparent pad 930 is electrically connected to the data metal pad DP.

The protective layer 850 is disposed in the channel opening 510 by protecting the channel pattern 400 exposed through the channel opening 510. The protective layer 850 may include an organic material.

Referring to FIGS. 1D and 1E, the TFT substrate does not include the alignment insulation pattern 500. When the TFT substrate does not include the alignment insulation pattern 500, the organic insulating pattern 600 covers the gate line GL, the gate electrode GE, the storage line SL and the storage electrode SE. Particularly, the organic insulating pattern 600 covers the channel pattern 400, the gate insulation pattern 300 and the storage electrode SE.

In this embodiment, the channel pattern 400 is formed on the central portion of the gate electrode GE, and is smaller than the gate electrode GE when viewed from a plan view. Thus, a mis-alignment between the channel pattern 400 and the gate electrode GE may be prevented and/or reduced.

FIGS. 2A and 2B are cross-sectional views illustrating a TFT substrate according to another exemplary embodiment of the present invention. Particularly, FIG. 2A is a cross-sectional view taken along a line I-I' of FIG. 1A, and FIG. 2B is a cross-sectional view taken along a line II-II' of FIG. 1A.

Referring to FIGS. 1A, 2A and 2B, a TFT substrate includes a base substrate 100, a gate metal pattern 200, a gate insulation pattern 300, a channel pattern 400, an alignment insulation pattern 500, a first organic insulation pattern 600, a data metal pattern 700, a second organic insulation pattern 800 and a transparent metal pattern 900.

The base substrate 100, the gate metal pattern 200, the gate insulation pattern 300, the channel pattern 400, the alignment insulation pattern 500, the first organic insulation pattern 600 and the data metal pattern 700 are substantially the same as the base substrate, the gate metal pattern, the gate insulation pattern, the channel pattern, the alignment insulation pattern, the organic insulation pattern and the data metal pattern illustrated in FIGS. 1A and 1C. Thus, any further explanation concerning the same elements will be omitted.

The second organic insulation pattern 800 is formed on the base substrate 100, and covers a gate connection pattern GCP, a data line DL, a data metal pattern DP, a source electrode SE, a drain electrode DE, and the first organic insulation pattern 600. The second organic insulation pattern 800 has a predetermined thickness, and planarizes a surface of the TFT substrate.

The second organic insulation pattern 800 has a first contact hole 810 formed on the drain electrode DE, a second contact hole 820, formed on the gate pad contact hole 550 and a third contact hole 830 formed on the data metal pad DP.

The transparent metal pattern 900 is formed on the second organic insulation pattern 800, and includes a transparent conductive material. The transparent metal pattern 900 includes a pixel electrode 910, a gate transparent pad 920 and a data transparent pad 930.

The pixel electrode 910 is formed on the second organic insulation pattern 800 in each pixel, and is electrically connected to the drain electrode DE through the first contact hole 810.

The gate transparent pad 920 is formed on the second organic insulation pattern 800, and is overlapped with the gate metal pad GP. The gate transparent pad 920 is electrically connected to the gate metal pad GP through the second contact hole 820 and the gate pad contact hole 550. The gate transparent pad 920 may have a substantially rectangular shape when viewed from a plan view.

The data transparent pad 930 is formed on the second organic insulation pattern 800, and is overlapped with the data metal pad DP. The data transparent pad 930 is electrically connected to the data metal pad DP through the third contact hole 830.

Method of Manufacturing a TFT Substrate

Figure 3A:
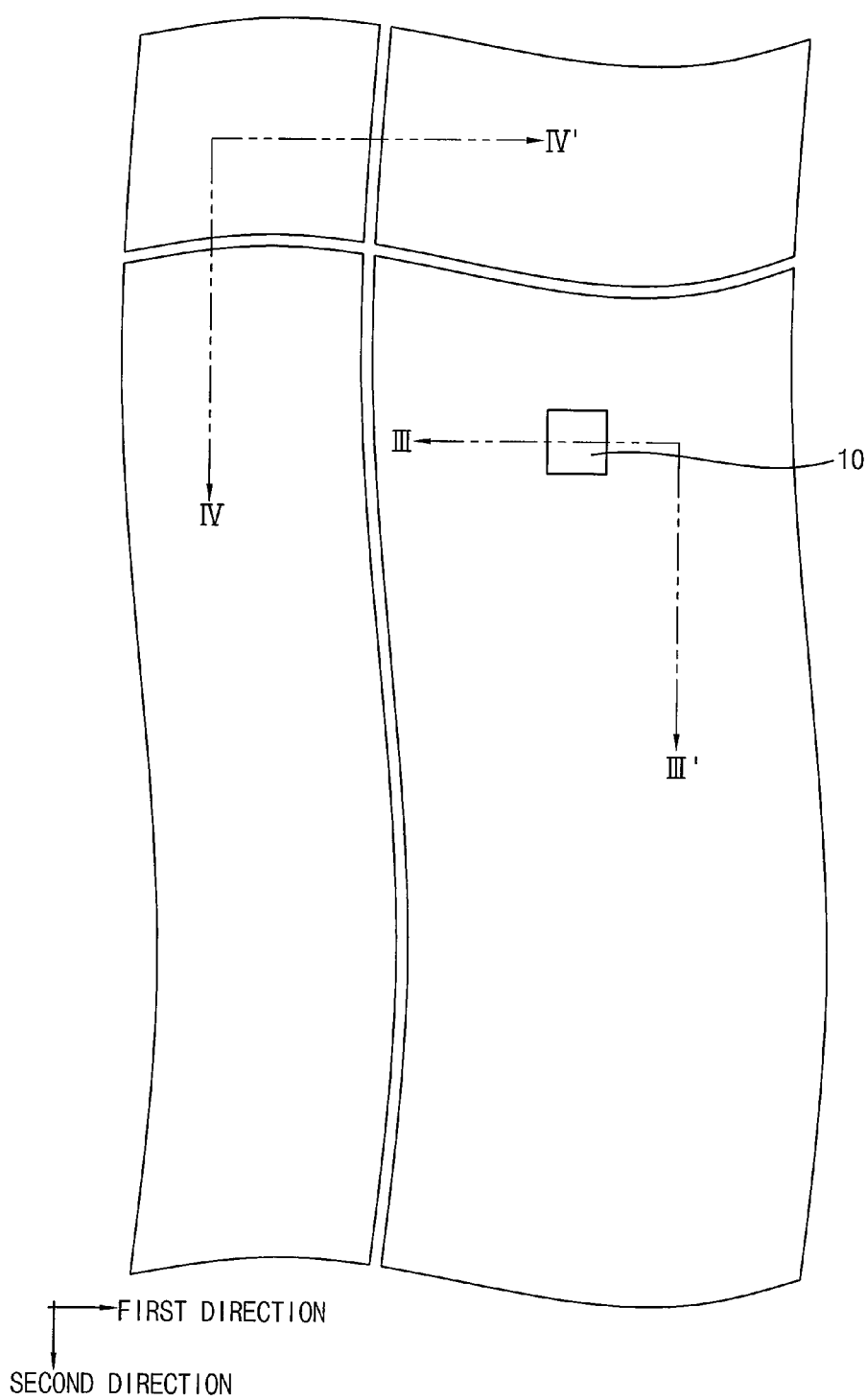
FIG. 3A is a plan view illustrating a method of manufacturing a TFT substrate according to an exemplary embodiment of the present invention.
Figure 3B:
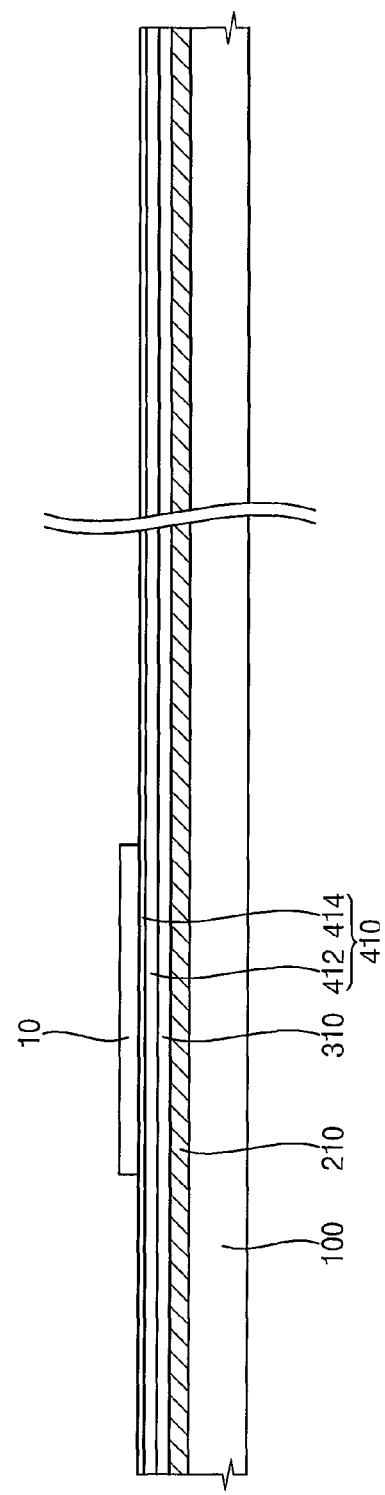
Figure 3C:
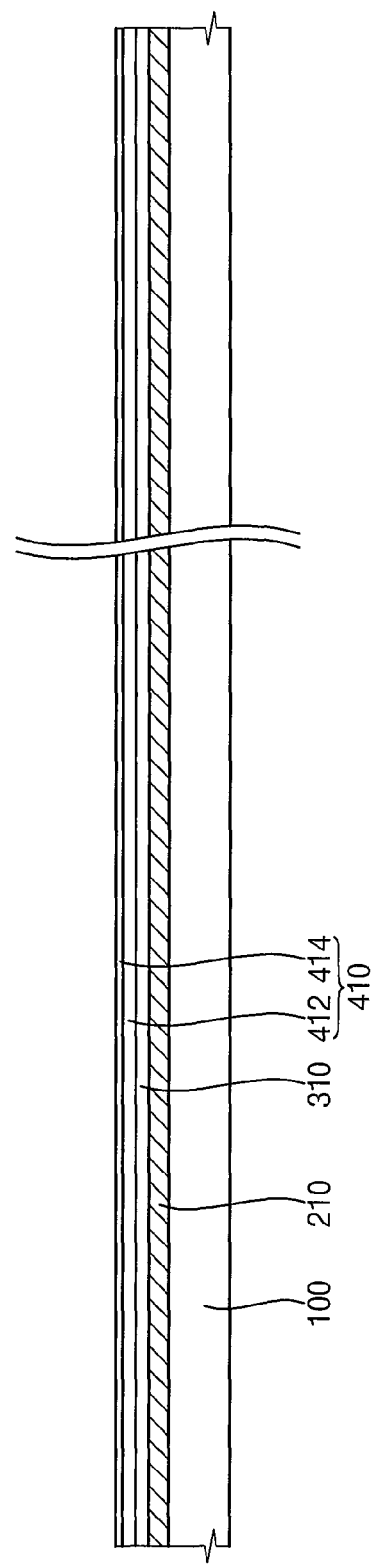
Figure 3E:
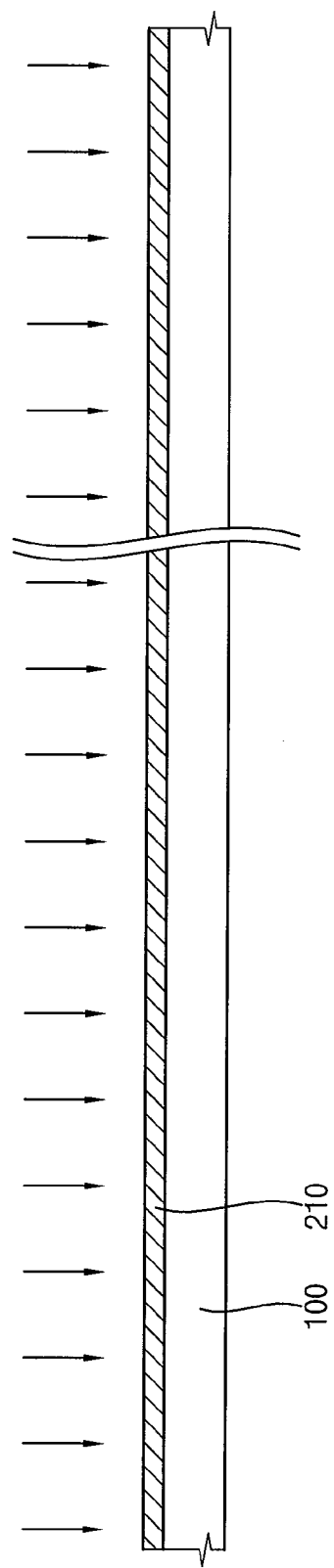

FIG. 3A is a plan view illustrating a method of manufacturing a TFT substrate according to an exemplary embodiment of the present invention, and FIGS. 3B, 3C, 3D and 3E are cross-sectional views illustrating the method of manufacturing a TFT substrate according to an exemplary embodiment of the present invention. Particularly, FIG. 3A is a plan view explaining the sequential deposition of a gate metal layer, a gate insulation layer, a channel layer and a photo-sensitive pattern. FIG. 3B is a cross-sectional view taken along a line III-III' of FIG. 3A, and FIG. 3C is a cross-sectional view taken along a line IV-IV' of FIG. 3A. FIG. 3D is a cross-sectional view explaining a process of etching the gate insulation layer and the channel layer using the photo-sensitive pattern in FIG. 3B. FIG. 3E is a cross-sectional view explaining a process of etching the gate insulation layer and the channel layer in FIG. 3C.

Referring to FIGS. 3A to 3C, a gate metal layer 210, a gate insulation layer 310 and a channel layer 410 are sequentially formed on a base substrate 100. For example, the gate metal layer 210 may be formed though a sputtering deposition method, and the gate insulation layer 310 and the channel layer 410 may be formed through a plasma enhanced chemical vapor deposition (PECVD) method. The base substrate 110 may include a transparent synthetic resin to reduce weight of the base substrate 110.

The channel layer 410 includes an active silicon layer 412 formed on the gate insulation layer 310 and an ion-doped silicon layer 414 formed on the active silicon layer 412. For example, the active silicon layer 412 may include amorphous silicon (a-Si), and the ion-doped silicon layer 414 may include amorphous silicon into which $n^+$ impurities are implanted at a high concentration.

A photo-sensitive pattern 10 is formed on a portion of the channel layer 410. Particularly, a photo-sensitive layer is formed on the channel layer 410. The photo-sensitive layer is exposed to light and then developed to form the photo-sensitive pattern 10.

Referring to FIGS. 3D and 3E, a portion of the channel layer 410 and a portion of the gate insulation layer 310 are etched using the photo-sensitive pattern 10 to form a channel pattern 400 and a gate insulation pattern 300. For example, the channel layer 410 and the gate insulation layer 310 may be etched through a dry etching process using plasma. After the channel layer 410 and the gate insulation layer 310 are etched, the photo-sensitive pattern 10 is removed.

The channel pattern 400 includes an active pattern 402 formed by removing a portion of the active silicon layer 412 and an ion-doped pattern 404 formed by removing a portion of the ion-doped silicon layer 414.

Figure 4A:
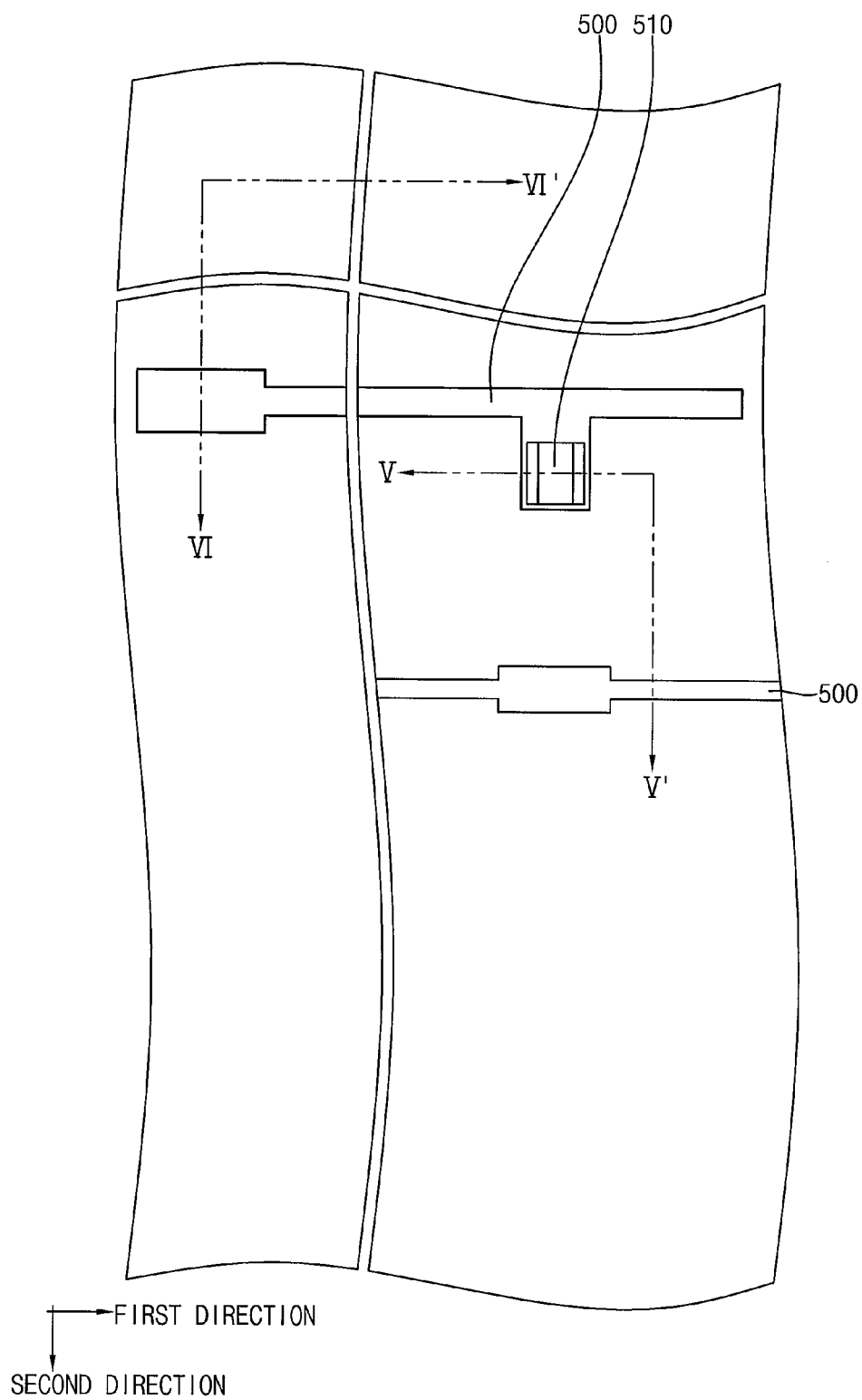
FIG. 4A is a plan view illustrating a process of forming a gate electrode in the method of manufacturing a TFT substrate according to an exemplary embodiment of the present invention.
Figure 4C:
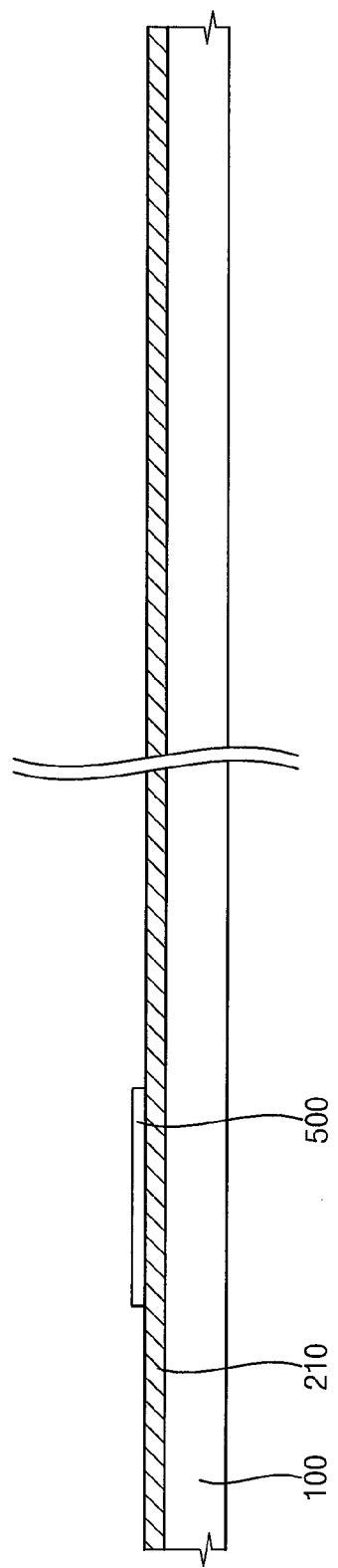
Figure 4D:
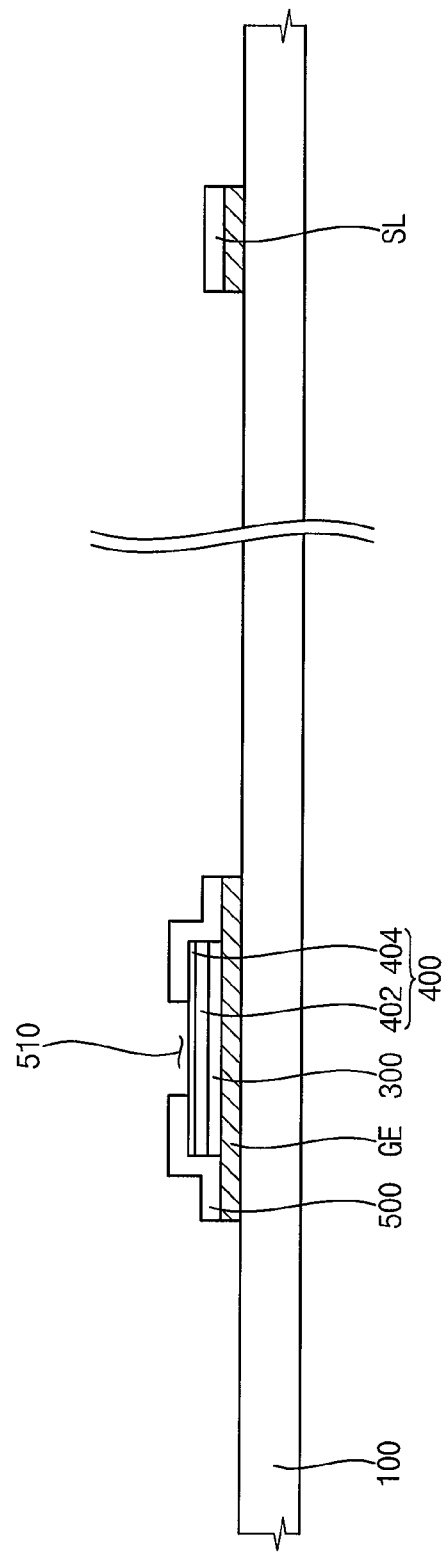
Figure 4E:
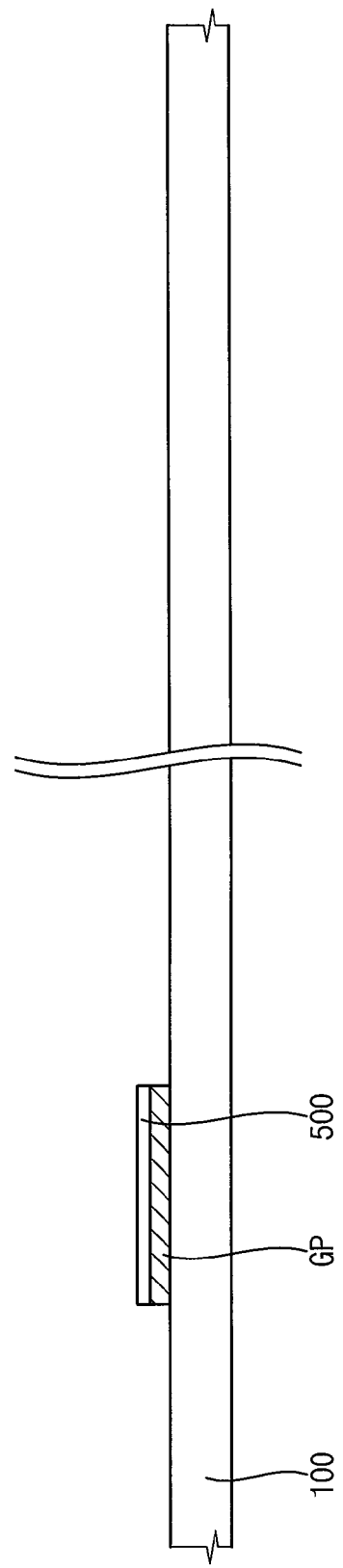

FIG. 4A is a plan view illustrating a process of forming a gate electrode in a method of manufacturing a TFT substrate according to an exemplary embodiment of the present invention, and FIGS. 4B, 4C, 4D and 4E are cross-sectional views illustrating a process of forming a gate electrode in a method of manufacturing a TFT substrate according to an exemplary embodiment of the present invention. Particularly, FIG. 4A is a plan view explaining a process of forming an alignment insulation pattern. FIG. 4B is a cross-sectional view taken along a line V-V' of FIG. 4A. FIG. 4C is a cross-sectional view taken along a line VI-VI' of FIG. 4A. FIG. 4D is a cross-sectional view explaining a process of etching a gate metal pattern using the alignment insulation pattern in FIG. 4B. FIG. 4E is a cross-sectional view explaining a process of etching the gate metal pattern using the alignment insulation pattern in FIG. 4C.

Referring to FIGS. 4A to 4C, an alignment insulation pattern 500 is formed on a portion of a gate metal layer 210. Particularly, the alignment insulation pattern 500 covers a whole portion of a channel pattern 400 and a whole portion of a gate insulation pattern 300, and has a channel opening 510 to expose a central portion of the channel pattern 400. Examples of a material that may be used for the alignment insulation pattern 500 may include silicon nitride ($Si_xN_y$), silicon oxide ($Si_xO_y$), and other insulating materials.

Particularly, an alignment insulation layer is formed on the gate metal layer 210 to cover the channel pattern 400 and the gate insulation pattern 300. A photo-sensitive layer is formed on the alignment insulation layer. The photo-sensitive layer is exposed to light and then developed to form a photo-sensitive pattern. A portion of the alignment insulation layer is etched using the photo-sensitive pattern to form the alignment insulation pattern 500.

Referring to FIGS. 4D and 4E, a portion of the gate metal layer 210 is etched using the alignment insulation pattern 500 to form a gate metal pattern 200. The gate metal pattern 200 includes a gate line GL, a gate electrode GE, a gate metal pad GP, a storage line SL and a storage electrode SE.

The gate line GL extends in a first direction, and a plurality of the gate lines GL is arranged in a second direction substantially perpendicular to the first direction. The gate electrode GE protrudes from the gate line GL in the second direction by a predetermined length. The gate metal pad GP is formed at an end of the gate line GL. The storage line SL extends in the first direction, and a plurality of the storage lines SL is arranged in the second direction. The storage electrode SE is electrically connected to the storage line SL.

The photo-sensitive pattern formed on the alignment insulation pattern 500 may be removed after the alignment insulation pattern 500 is formed. Alternatively, the photo-sensitive pattern may be removed after a portion of the gate metal layer 210 is etched using the photo-sensitive pattern to form the gate metal pattern 200.

The gate metal pattern 200 may be formed using the photo-sensitive pattern without forming the alignment insulation pattern 500. Particularly, a photo-sensitive pattern is formed through an exposure process to cover a whole portion of the channel pattern 400 and a whole portion of the gate insulation pattern 300. The photo-sensitive pattern exposes a central portion of the channel pattern 400. A portion of the gate metal layer 210 is etched using the photo-sensitive pattern. Thereafter, the photo-sensitive pattern is removed.

Figure 5A:
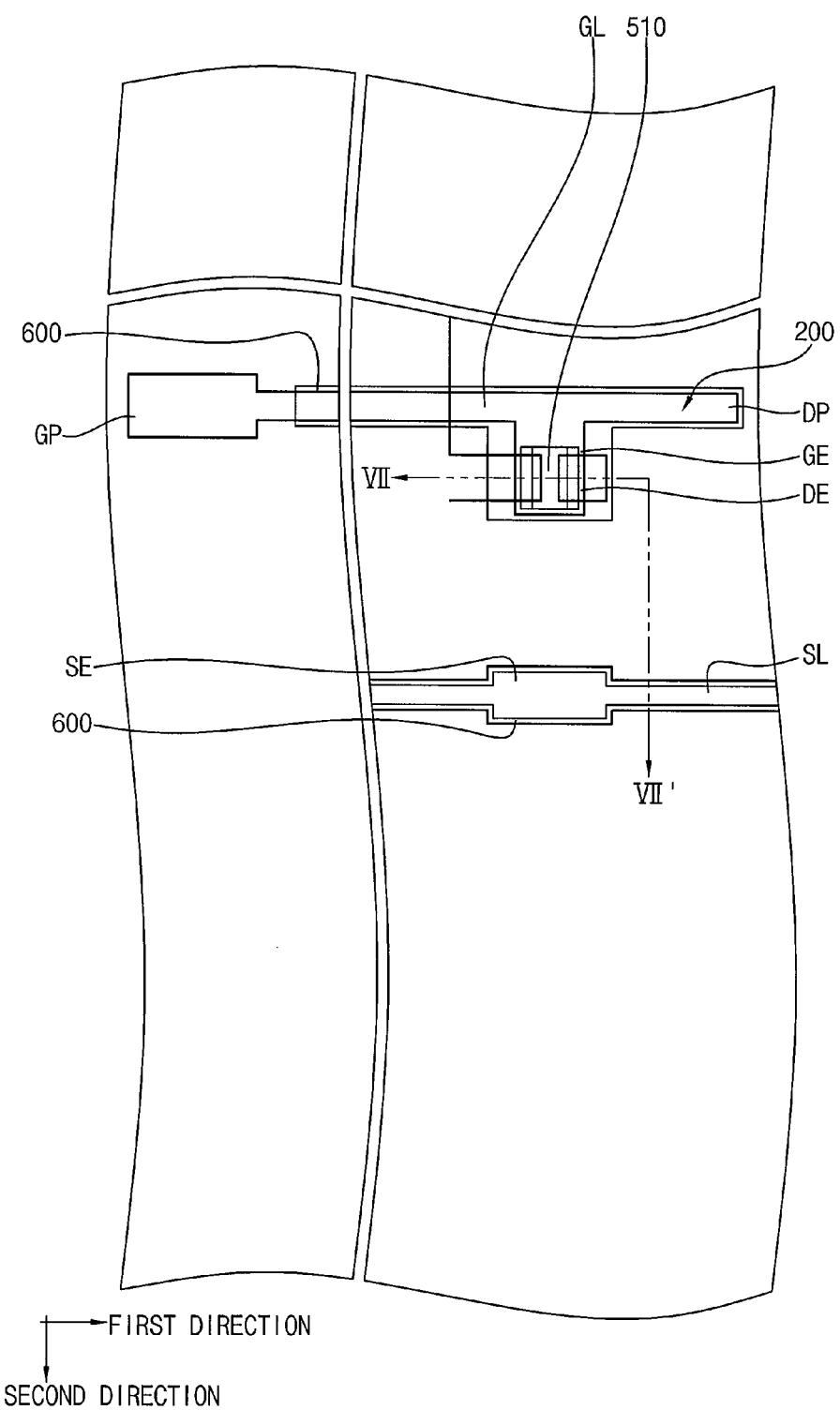
FIG. 5A is a plan view illustrating a process of forming a first organic insulation pattern in a method of manufacturing a TFT substrate according to an exemplary embodiment of the present invention.

FIG. 5A is a plan view illustrating a process of forming a first organic insulation pattern in a method of manufacturing a TFT substrate according to an exemplary embodiment of the present invention, and FIG. 5B is a cross-sectional view illustrating a process of forming a first organic insulation pattern in a method of manufacturing a TFT substrate according to an exemplary embodiment of the present invention. Particularly, FIG. 5B is a cross-sectional view taken along a line VII-VII' of FIG. 5A.

Referring to FIGS. 5A and 5B, a first organic insulation pattern 600 is formed on the base substrate 100 to cover the gate line GL, the gate electrode GE, the storage line SL and the storage electrode SE. The first organic insulation pattern 600 is large enough to cover a whole portion of each of the gate line GL, the gate electrode GE, the storage line SL and the storage electrode SE.

Particularly, a first organic insulation layer is formed on the base substrate 100 to cover the gate line GL, the gate electrode GE, the storage line SL and the storage electrode SE. The first organic insulation layer is patterned to form the first organic insulation pattern 600.

The first organic insulation pattern 600 has a channel opening 510 to expose a central portion of the channel pattern 400. Particularly, a portion of each of the alignment insulation pattern 500 and the first organic insulation pattern 600 is removed to form the channel opening 510 to expose the central portion of the channel pattern 400.

Figure 6A:
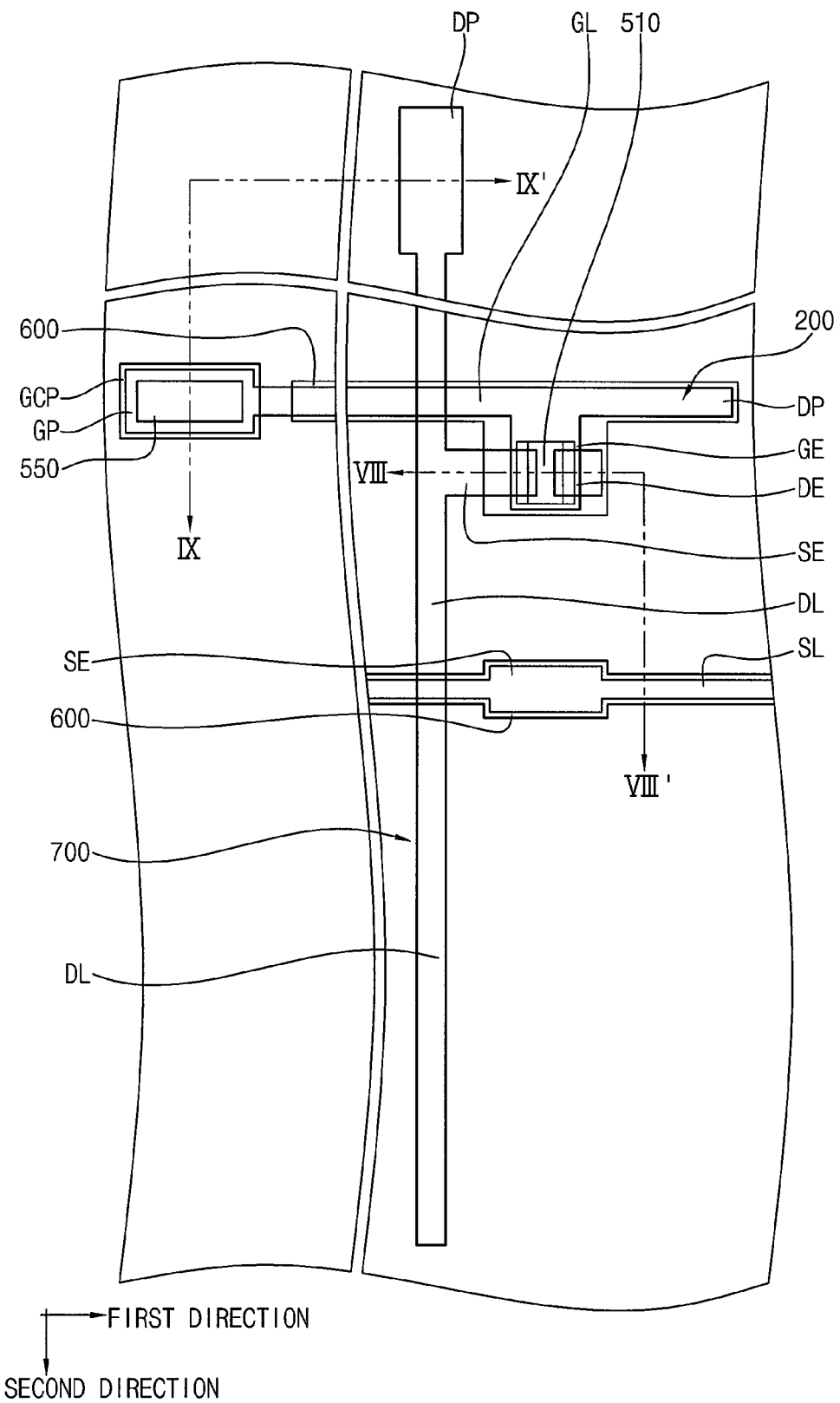
FIG. 6A is a plan view illustrating a process of forming a source electrode and a drain electrode in the method of manufacturing a TFT substrate according to an exemplary embodiment of the present invention.
Figure 6C:
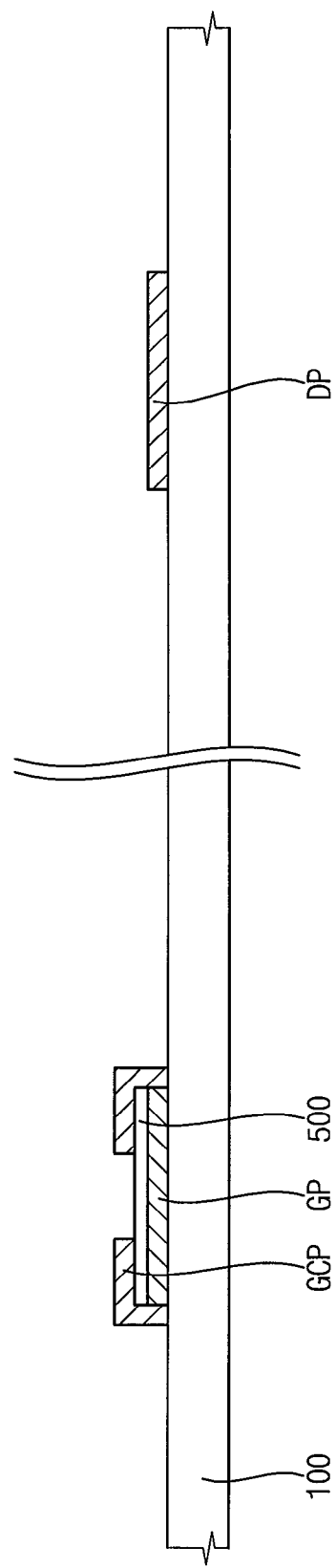
Figure 6E:
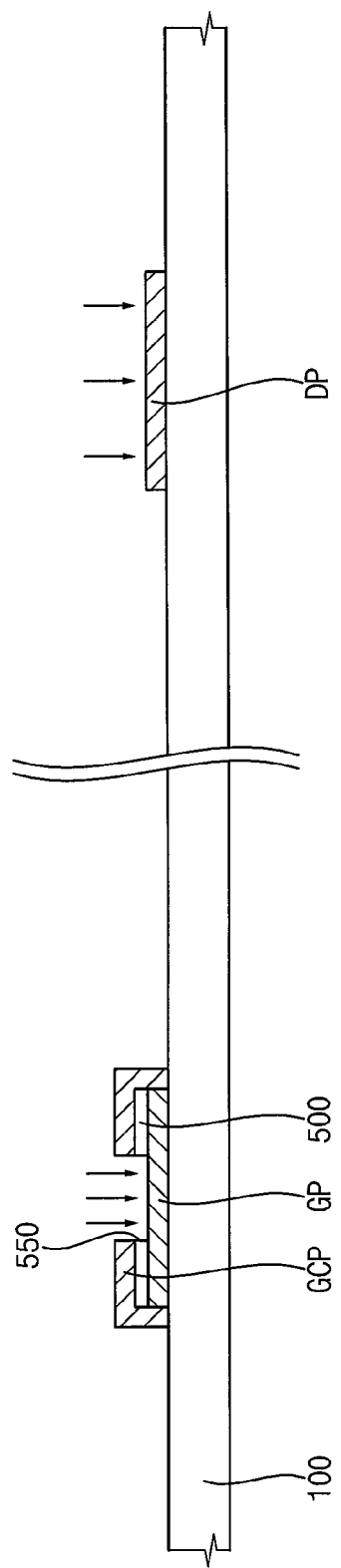

FIG. 6A is a plan view illustrating a process of forming a source electrode and a drain electrode in a method of manufacturing a TFT substrate according to an exemplary embodiment of the present invention, and FIGS. 6B, 6C, 6D and 6E are cross-sectional views illustrating a process of forming a source electrode and a drain electrode in a method of manufacturing a TFT substrate according to an exemplary embodiment of the present invention. Particularly, FIG. 6A is a plan view explaining a process of forming a data metal pattern. FIG. 6B is a cross-sectional view taken along a line VIII-VIII' of FIG. 6A. FIG. 6C is a cross-sectional view taken along a line IX-IX' of FIG. 6A. FIG. 6D is a cross-sectional view explaining a process of etching a portion of an ion-doped pattern in FIG. 6B. FIG. 6E is a cross-sectional view explaining a process of etching a portion of an alignment insulation pattern in FIG. 6C.

Referring to FIGS. 6A to 6C, a data metal pattern 700 is formed on the base substrate 100. Particularly, a data metal layer is formed on the base substrate 100 and then patterned to form the data metal pattern 700.

The data metal pattern 700 includes a data line DL, a source electrode SE, a drain electrode DE, a data metal pad DP and a gate connection pad GCP.

The data line DL extends in the second direction to cross the gate line GL, and a plurality of the data lines DL are arranged in the first direction. The data line DL is electrically insulated from the gate line GL by the first organic insulation pattern 600 and the alignment insulation pattern 500.

The source electrode SE protrudes from the data line DL in the first direction by a predetermined length. The source electrode SE is formed on a portion of the base substrate 100 and a portion of the first organic insulation pattern 600. Furthermore, a portion of the source electrode SE is formed in the channel opening 510 to make contact with a portion of the ion-doped pattern 404.

The drain electrode DE is spaced apart from the source electrode SE, and is formed on the first organic insulation pattern 600. A portion of the drain electrode DE is formed in the channel opening 510 to make contact with a portion of the ion-doped pattern 404.

The data metal pad DP is formed at an end of the data line DL. The gate connection pad GCP is formed on the base substrate 100 to cover the alignment insulation pattern 500 and the gate metal pad GP, and is partially opened to expose a portion of the alignment insulation pattern 500.

Referring to FIGS. 6D and 6E, a portion of each of the channel pattern 400 and the alignment insulation pattern 500 is formed using the data metal pattern 700.

Particularly, a portion of the ion-doped pattern 404 is etched using the source electrode SE and the drain electrode DE as a mask so that the ion-doped pattern 404 has two portions spaced apart from each other. Furthermore, a portion of the alignment insulation pattern 500 is etched using the gate connection pad GCP as a mask so that a gate pad contact hole 500 is formed through the alignment insulation pattern 500.

Referring to FIGS. 1A to 1C, a transparent metal pattern 900 is formed on the base substrate 100. Particularly, a transparent metal layer is formed on the base substrate 100 and then patterned to form the transparent metal pattern 900.

The transparent metal pattern 900 includes a pixel electrode 910, a gate transparent pad 920 and a data transparent pad 930.

The pixel electrode 910 is overlapped with a portion of the drain electrode DE, and is electrically connected to the drain electrode DE. The gate transparent pad 920 covers the gate connection pad GCP, the alignment insulation pattern 500 and the gate metal pad GP, and is electrically connected to the gate metal pad GP through the gate pad contact hole 550. The data transparent pad 930 is formed on the base substrate 100 to cover the data metal pad DP, and is electrically connected to the data metal pad DP.

After the transparent metal pattern 900 is formed, a protective layer 850 is formed in the channel opening 510. Particularly, an organic material is applied in the channel opening 510 to form the protective layer 850. The protective layer 850 covers a portion of the channel pattern 400, which is exposed through the channel opening 510 to protect the channel pattern 400.

In this embodiment, the gate electrode GE is not formed before the channel pattern 400 is formed, but formed after the channel pattern 400 is formed. Thus, channel pattern 400 is aligned with respect to the gate electrode SE.

Particularly, when channel pattern 400 is formed after the gate electrode GE, the base substrate 100 may be heated during the process of forming the channel pattern 400, causing expansion or distortion of the base substrate. Particularly, the base substrate 100 including a transparent synthetic resin may expand or distort to a greater degree. When the base substrate 100 is expanded or distorted, the position of the gate electrode GE formed on the base substrate may be changed, resulting in a mis-alignment between the channel pattern 400 and the gate electrode GE.

In this embodiment, the gate electrode GE is formed after the channel pattern 400 is formed. Thus, the position of the gate electrode GE is prevented from being changed by an expansion or distortion of the base substrate 100, preventing a mis-alignment between the channel pattern 400 and the gate electrode GE.

In this embodiment, the protective layer 850 is formed in the channel opening 510. However, a second organic insulation pattern may be formed instead of the protective layer 850.

Referring to FIGS. 2A and 2B, a second organic insulation pattern 800 is formed on the base substrate 100 after the data metal pattern 700 is formed and a portion of each of the ion-doped pattern 404 and the alignment insulation pattern 500.

The second organic insulation pattern 800 covers and protects the gate connection pattern GCP, the data line DL, the data metal pattern DP, the drain electrode DE and the first organic insulation pattern 600. The second organic insulation pattern 800 has a predetermined thickness to planarize a surface of the TFT substrate.

The second organic insulation pattern 800 has a first contact hole 810 formed on the drain electrode DE, a second contact hole 820 formed on the gate pad contact hole 550 and a third contact hole 830 formed on the data metal pad DP.

The transparent metal pattern 900 is formed on the second organic insulation pattern 800. The transparent metal pattern 900 includes the pixel electrode 910, the gate transparent pad 920 and the data transparent pad 930.

The pixel electrode 910 is formed on the second organic insulation pattern 800, and is electrically connected to the drain electrode DE through the first contact hole 810. The gate transparent pad 920 is formed on the second organic insulation pattern 800, and is overlapped with the gate metal pad GP. The gate transparent pad 920 is electrically connected to the gate metal pad GP through the gate pad contact hole 550. The data transparent pad 930 is formed on the second organic insulation pattern 800, and is overlapped with the data metal pad DP. The data transparent pad 930 is electrically connected to the data metal pad DP through the third contact hole 830.

According to the above, a gate electrode is formed after a channel pattern is formed. Thus, a mis-alignment between the channel pattern and the gate electrode may be prevented. Therefore, a display quality may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a thin-film transistor (TFT) substrate, the method comprising:
   sequentially forming a gate metal layer, a gate insulation layer and a channel layer on a base substrate;
   patterning the channel layer and the gate insulation layer to form a channel pattern and a gate insulation pattern, each having a width;
   forming an alignment insulation layer covering the channel pattern and the gate insulation pattern on the gate metal layer; and
   patterning the alignment insulation layer to form an alignment insulation pattern; and
   patterning the gate metal layer using the alignment insulation pattern to form a gate electrode having a width greater than the width of the channel pattern;
   wherein an edge of the alignment insulation pattern coincides with an edge of the gate electrode.

2. The method of claim 1, further comprising:
   forming a first organic insulation pattern that covers the alignment insulation layer, the gate insulation pattern and the gate electrode and has an opening to expose a portion of the channel pattern; and
   forming a source electrode and a drain electrode to contact the channel pattern through the opening such that the source electrode and drain electrode are spaced apart from each other by a predetermined distance.

3. The method of claim 2, further comprising forming a pixel electrode that is electrically connected to the drain electrode.

4. The method of claim 3, further comprising applying an ink in the opening to form a protective layer to protect an exposed portion of the channel pattern.

5. The method of claim 3, further comprising forming a second organic insulation pattern that covers the source electrode, the drain electrode and the first organic insulation pattern to planarize a surface of the base substrate, and has an opening to expose a portion of the drain electrode, wherein the pixel electrode is formed on the second organic insulation pattern and is electrically connected to the drain electrode through the contact hole.

6. The method of claim 1, wherein patterning the alignment insulation layer to form an alignment insulation pattern comprises:
   forming a photo-sensitive pattern that covers the channel pattern and the gate insulation pattern, and is larger than the gate insulation pattern, and exposes a portion of the alignment insulation layer, which corresponds to the opening; and
   etching a portion of the alignment insulation layer using the photo-sensitive pattern to form an alignment insulation pattern.

7. The method of claim 6, wherein forming the gate electrode further comprises removing the photo-sensitive pattern.

8. The method of claim 1, wherein the channel layer comprises:
   an active silicon layer formed on the gate insulation layer; and
   an ion-doped silicon layer formed on the active silicon layer.

9. The method of claim 8, further comprising etching a portion of the ion-doped pattern using the source electrode and the drain electrode to divide the ion-doped pattern into two portions spaced apart from each other.

10. The method of claim 8, wherein the active silicon layer comprises an amorphous silicon (a-Si), and the ion-doped silicon layer comprises an amorphous silicon into which $n^+$ impurities are implanted at a relatively high concentration.

11. The method of claim 1, wherein the base substrate comprises a transparent synthetic resin.

12. A method of manufacturing a thin-film transistor (TFT) substrate, the method comprising:
   sequentially forming a gate metal layer, a gate insulation layer and a channel layer on a base substrate;
   patterning the channel layer and the gate insulation layer in a sequential process to form a channel pattern and a gate insulation pattern having a shape substantially the same as a shape of the channel pattern;
   forming an alignment insulation layer covering the channel pattern and the gate insulation pattern on the gate metal layer;
   patterning the alignment insulation layer to form an alignment insulation pattern;
   patterning the gate metal layer using the alignment insulation pattern to form a gate electrode larger than the gate insulation pattern;
   forming a first organic insulation pattern that covers the alignment insulation pattern, the gate insulation pattern and the gate electrode and has an opening to expose a portion of the channel pattern; and
   forming a source electrode and a drain electrode, which makes contact with the channel pattern through the opening and are spaced apart from each other by a predetermined distance,
   wherein an edge of the alignment insulation pattern coincides with an edge of the gate electrode.

* * * * *